United States Patent
Koepp et al.

(10) Patent No.: US 8,881,373 B1
(45) Date of Patent: Nov. 11, 2014

(54) ASSEMBLING A RADIO FREQUENCY IDENTIFICATION (RFID) TAG PRECURSOR

(71) Applicant: Impinj, Inc., Seattle, WA (US)

(72) Inventors: Ronald Lee Koepp, Snoqualmie, WA (US); Ronald A. Oliver, Seattle, WA (US); Harley Heinrich, Snohomish, WA (US); Jaideep Mavoori, Mercer Island, WA (US); Tan Mau Wu, Seattle, WA (US); Christopher J. Diorio, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 13/776,346

(22) Filed: Feb. 25, 2013

Related U.S. Application Data

(63) Continuation-in-part of application No. 13/456,653, filed on Apr. 26, 2012, now Pat. No. 8,661,652.

(60) Provisional application No. 61/035,710, filed on Mar. 11, 2008, provisional application No. 61/713,058, filed on Oct. 12, 2012.

(51) Int. Cl.
*H01P 11/00* (2006.01)
*G06K 19/07* (2006.01)

(52) U.S. Cl.
CPC ............ *G06K 19/0723* (2013.01); *H01P 11/00* (2013.01)
USPC ...................... 29/600; 29/592.1; 343/700 MS

(58) Field of Classification Search
USPC ................. 29/600, 592.1, 830–832; 235/492; 343/700 MS, 786; 340/752.1–572.7
See application file for complete search history.

(56) References Cited

U.S. PATENT DOCUMENTS

| | | | |
|---|---|---|---|
| 6,147,605 A * | 11/2000 | Vega et al. ................. 340/572.7 |
| 7,379,024 B2 * | 5/2008 | Forster et al. .......... 343/700 MS |
| 7,444,735 B2 * | 11/2008 | Yeo et al. ......................... 29/600 |
| 7,482,251 B1 * | 1/2009 | Paulsen et al. ................ 438/460 |
| 7,501,947 B2 * | 3/2009 | Youn ........................... 340/572.1 |
| 7,750,813 B2 * | 7/2010 | Deavours et al. .......... 340/572.7 |
| 8,188,927 B1 * | 5/2012 | Koepp et al. ........... 343/700 MS |
| 8,511,569 B1 * | 8/2013 | Koepp et al. .................. 235/492 |
| 2011/0011939 A1 * | 1/2011 | Seah ............................. 235/492 |

FOREIGN PATENT DOCUMENTS

WO 2013154603 A 10/2013

* cited by examiner

*Primary Examiner* — Minh Trinh
(74) *Attorney, Agent, or Firm* — Turk IP Law, LLC

(57) ABSTRACT

An assembly having an RFID integrated circuit (IC), a nonconductive repassivation layer on a surface of the IC and confined within a perimeter of the surface, and a conductive redistribution layer on the repassivation layer and confined within the perimeter of the surface may be provided. At least a first portion of the redistribution layer may be electrically connected to the IC through a first opening in the repassivation layer. Furthermore, a substrate having a first antenna terminal may be provided, and a second opening may be formed in a nonconductive barrier present on at least one of the first antenna terminal and the first portion of the redistribution layer with an etchant. The first opening and the second opening may be nonoverlapping. The assembly may be attached to the substrate with an adhesive.

9 Claims, 15 Drawing Sheets

CONCEPTUAL DIAGRAM OF
AN ASSEMBLED RFID TAG

RFID SYSTEM

RFID TAG

CONCEPTUAL DIAGRAM OF
AN ASSEMBLED RFID TAG

*DIE CONFIGURATION COMPARISONS PRIOR TO ATTACHMENT STEP*

CAPACITIVELY COUPLED INLAY
CONSTRUCTION

GALVANICALLY COUPLED INLAY CONSTRUCTION

CROSS SECTION OF INLAY
AFTER THERMAL STEP

CONCEPTUAL DIAGRAM OF AN
ASSEMBLED RFID TAG
ACCORDING TO EMBODIMENTS

1400

1450

1600

1610
PROVIDING AN ASSEMBLY HAVING AN RFID INTEGRATED CIRCUIT (IC), A NONCONDUCTIVE REPASSIVATION LAYER ON A SURFACE OF THE IC AND CONFINED WITHIN A PERIMETER OF THE SURFACE, AND A CONDUCTIVE REDISTRIBUTION LAYER ON THE REPASSIVATION LAYER AND CONFINED WITHIN THE PERIMETER OF THE SURFACE, IN WHICH AT LEAST A FIRST PORTION OF THE REDISTRIBUTION LAYER IS ELECTRICALLY CONNECTED TO THE IC THROUGH A FIRST OPENING IN THE REPASSIVATION LAYER

↓

1620
PROVIDING A SUBSTRATE HAVING A FIRST ANTENNA TERMINAL

↓

1630
FORMING A SECOND OPENING IN A NONCONDUCTIVE BARRIER PRESENT ON AT LEAST ONE OF THE FIRST ANTENNA TERMINAL AND THE FIRST PORTION OF THE REDISTRIBUTION LAYER WITH AN ETCHANT, WHERE THE FIRST OPENING AND THE SECOND OPENING ARE NONOVERLAPPING

↓

1640
ATTACHING THE ASSEMBLY TO THE SUBSTRATE WITH AN ADHESIVE

↓

1650
FORMING A FIRST ELECTRICAL CONNECTION BETWEEN THE FIRST ANTENNA TERMINAL AND THE FIRST PORTION OF THE REDISTRIBUTION LAYER THROUGH THE SECOND OPENING

FIG. 16

ASSEMBLING A RADIO FREQUENCY IDENTIFICATION (RFID) TAG PRECURSOR

CROSS REFERENCE TO RELATED APPLICATIONS

This application is a continuation-in-part of U.S. patent application Ser. No. 13/456,653 filed on Apr. 26, 2012. This application also claims the benefit of U.S. Provisional Patent Application Ser. Nos. 61/035,710 and 61/713,058 filed on Mar. 11, 2008 and Oct. 12, 2012, respectively. The disclosures of the above patent applications are hereby incorporated by reference for all purposes.

BACKGROUND

Radio-Frequency Identification (RFID) systems typically include RFID readers, also known as RFID reader/writers or RFID interrogators, and RFID tags. RFID systems can be used to inventory, locate, identify, authenticate, configure, enable/disable, and monitor items to which the tags are attached or in which the tags are embedded. RFID systems may be used in retail applications to inventory and track items; in consumer- and industrial-electronics applications to configure and monitor items; in security applications to prevent loss or theft of items; in anti-counterfeiting applications to ensure item authenticity; and in myriad other applications.

RFID systems operate by an RFID reader interrogating one or more tags using a Radio Frequency (RF) wave. The RF wave is typically electromagnetic, at least in the far field. The RF wave can also be predominantly electric or magnetic in the near field. The RF wave may encode one or more commands that instruct the tags to perform one or more actions.

A tag that senses the interrogating RF signal may reply with a responding RF signal (a response). The responding RF signal may be generated by the tag, or it may be formed by the tag reflecting back a portion of the interrogating RF signal in a process known as backscatter. Backscatter may take place in a number of ways.

The reader receives, demodulates, and decodes the response. The decoded response may include data stored in the tag such as a serial number, price, date, time, destination, encrypted message, electronic signature, other attribute(s), any combination of attributes, or any other suitable data. The decoded response may also encode status information about the tag, the item to which the tag is attached, or the item into which the tag is embedded such as a tag status message, item status message, configuration data, or any other status information.

An RFID tag typically includes an antenna and an RFID integrated circuit (IC) comprising a radio section, a power management section, and frequently a logical section, a memory, or both. In some RFID ICs the logical section includes a cryptographic algorithm which may rely on one or more passwords or keys stored in tag memory. In earlier RFID tags the power management section often used an energy storage device such as a battery. RFID tags with an energy storage device are known as battery-assisted, semi-active, or active tags. Advances in semiconductor technology have miniaturized the IC electronics so that an RFID tag can be powered solely by the RF signal it receives. Such RFID tags do not include a long-term energy-storage device and are called passive tags. Of course, even passive tags typically include temporary energy- and data/flag-storage elements such as capacitors or inductors.

BRIEF SUMMARY

This summary is provided to introduce a selection of concepts in a simplified form that are further described below in the Detailed Description. This summary is not intended to identify key features or essential features of the claimed subject matter, nor is it intended as an aid in determining the scope of the claimed subject matter.

Some embodiments are directed to RFID tag assembly. An RFID IC assembly having a repassivation layer and a conductive redistribution layer may be assembled onto a tag substrate with an additional layer. The additional layer may include one or more etchants or reactants for forming an electrical connection through a nonconductive barrier layer between the assembly and the substrate, and may also include an adhesive for attaching the assembly to the substrate. Other embodiments may be directed to patterned and/or nonoverlapping contact areas on an IC, IC self-assembly using liquids or other forces, and/or IC testing.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

The following Detailed Description proceeds with reference to the accompanying Drawings, in which:

FIG. 16 illustrates a method for assembling a Radio Frequency Identification (RFID) tag precursor according to embodiments.

DETAILED DESCRIPTION

In the following detailed description, references are made to the accompanying drawings that form a part hereof, and in which are shown by way of illustrations specific embodiments or examples. These aspects may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

Figure 1:
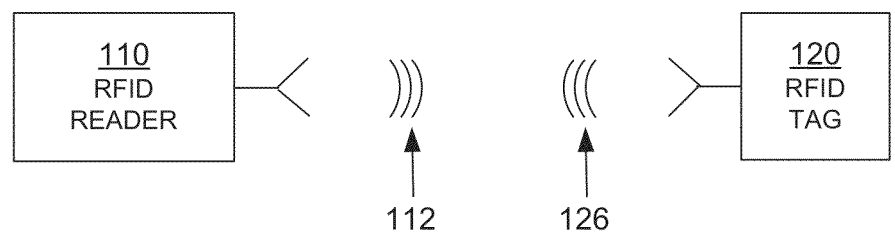
FIG. 1 is a block diagram of components of an RFID system.

FIG. 1 is a diagram of the components of a typical RFID system 100, incorporating embodiments. An RFID reader 110 transmits an interrogating RF signal 112. RFID tag 120 in the vicinity of RFID reader 110 senses interrogating RF signal 112 and generate signal 126 in response. RFID reader 110 senses and interprets signal 126. The signals 112 and 126 may include RF waves and/or non-propagating RF signals (e.g., reactive near-field signals).

Reader 110 and tag 120 communicate via signals 112 and 126. When communicating, each encodes, modulates, and transmits data to the other, and each receives, demodulates, and decodes data from the other. The data can be modulated onto, and demodulated from, RF waveforms. The RF waveforms are typically in a suitable range of frequencies, such as those near 900 MHz, 13.56 MHz, and so on.

The communication between reader and tag uses symbols, also called RFID symbols. A symbol can be a delimiter, a calibration value, and so on. Symbols can be implemented for exchanging binary data, such as "0" and "1", if that is desired. When symbols are processed by reader 110 and tag 120 they can be treated as values, numbers, and so on.

Tag 120 can be a passive tag, or an active or battery-assisted tag (i.e., a tag having its own power source). When tag 120 is a passive tag, it is powered from signal 112.

Figure 2:
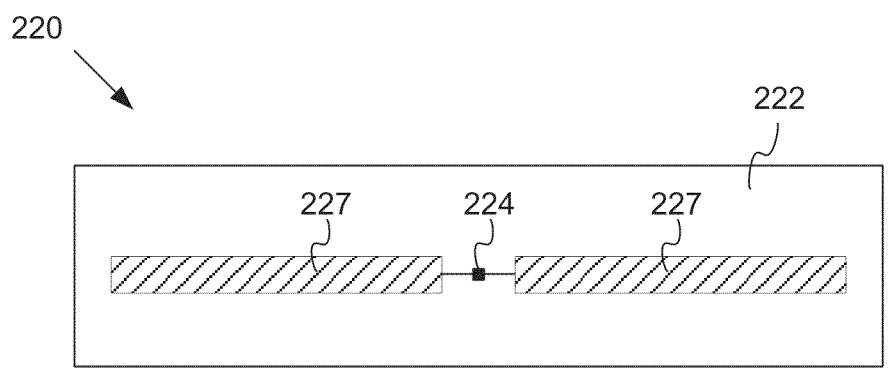
FIG. 2 is a diagram showing components of a passive RFID tag, such as a tag that can be used in the system of FIG. 1.

FIG. 2 is a diagram of an RFID tag 220, which may function as tag 120 of FIG. 1. Tag 220 is drawn as a passive tag, meaning it does not have its own power source. Much of what is described in this document, however, applies also to active and battery-assisted tags.

Tag 220 is typically (although not necessarily) formed on a substantially planar inlay 222, which can be made in many ways known in the art. Tag 220 includes a circuit which is preferably implemented as an IC 224. In some embodiments IC 224 is implemented in complementary metal-oxide semiconductor (CMOS) technology. In other embodiments IC 224 may be implemented in other technologies such as bipolar junction transistor (BJT) technology, metal-semiconductor field-effect transistor (MESFET) technology, and others as will be well known to those skilled in the art. IC 224 is arranged on inlay 222.

Tag 220 also includes an antenna for exchanging wireless signals with its environment. The antenna is often flat and attached to inlay 222. IC 224 is electrically coupled to the antenna via suitable antenna contacts (not shown in FIG. 2).

IC 224 is shown with a single antenna port, comprising two antenna contacts electrically coupled to two antenna segments 227 which are shown here forming a dipole. Many other embodiments are possible using any number of ports, contacts, antennas, and/or antenna segments.

In operation, the antenna receives a signal and communicates it to IC 224, which both harvests power and responds if appropriate based on the incoming signal and the IC's internal state. If IC 224 uses backscatter modulation then it responds by modulating the antenna's reflectance, thereby generating response signal 126 from signal 112 transmitted by the reader. Electrically coupling and uncoupling the antenna contacts of IC 224 can modulate the antenna's reflectance, as can varying the admittance of a shunt-connected circuit element which is coupled to the antenna contacts. Varying the impedance of a series-connected circuit element is another way to modulate the antenna's reflectance.

In the embodiment of FIG. 2, antenna segments 227 are separate from IC 224. In other embodiments the antenna segments may be formed on IC 224. Tag antennas according to embodiments may be designed in any form and are not limited to dipoles. For example, the tag antenna may be a patch, a slot, a loop, a coil, a horn, a spiral, or any other suitable antenna.

Figure 3:
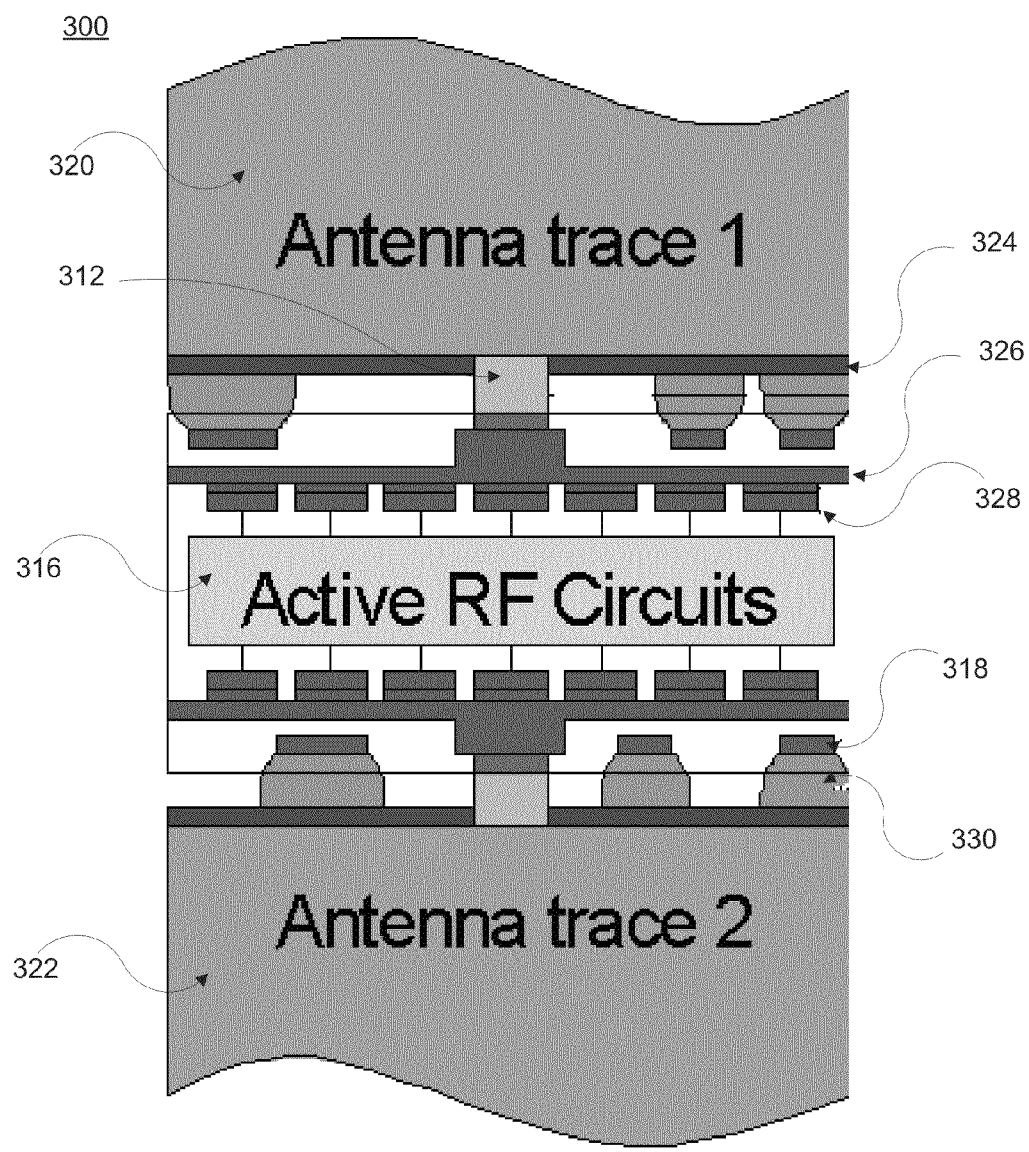
FIG. 3 is a conceptual diagram of an assembled RFID tag.

FIG. 3 is a conceptual diagram of an assembled RFID tag. An RFID IC includes electrical circuit elements (e.g. active RF circuits 316) and connecting traces. The IC may include multiple layers containing RF and non-RF circuits. Electrical connections for RF circuits may be coupled to an RF distribution bus 324 through coupling capacitors 326. Non-RF traces 318 may be separated from the RF traces (e.g., the RF distribution bus 324).

The antenna of tag 300 is illustrated in FIG. 3 as antenna trace 1 (320) and antenna trace 2 (322). The antenna is typically formed as a thin trace of metal—e.g. aluminum or copper—affixed onto the IC with one or more connection points for connecting the antenna to the RF circuits (through RF distribution bus 326). When an oxidizing metal like aluminum is used, a naturally forming oxide layer 324 creates a hard surface between the antenna traces and the IC.

One disadvantage of many tag assembly methods is that the antenna layer has to be accurately aligned with the IC to ensure that the antenna is properly coupled to the RF distribution bus. In these assembly techniques, the antenna connections are commonly aligned with the RF distribution bus using a gold or similarly-topped bump 312 applied through a post-processing step. Even so, assembly may be rather difficult because it requires tightly-controlled mounting forces and high-precision IC placement.

Certain assembly methods may also result in IC performance reductions due to RF distribution bus resistance and parasitic capacitance (330) between non-RF IC traces 318 and antenna traces 320;322. The high mounting force used for IC bump 312 to penetrate the hard antenna oxide layer 324 to contact the antenna trace 320 may lead to reliability and yield problems. In addition, such high mounting forces may also exacerbate parasitic capacitance effects by reducing separation distance between the antenna traces and the IC surface.

Conductive adhesives (e.g. isotropic or anisotropic conductor paste adhesive) can be used to alleviate some of these disadvantages, but adhesives may introduce other complications. For example, many adhesives may limit tag assembly throughput because they must be applied in viscous fluid form immediately prior to IC placement and require continuous pressure and heat to cure.

Figure 4:
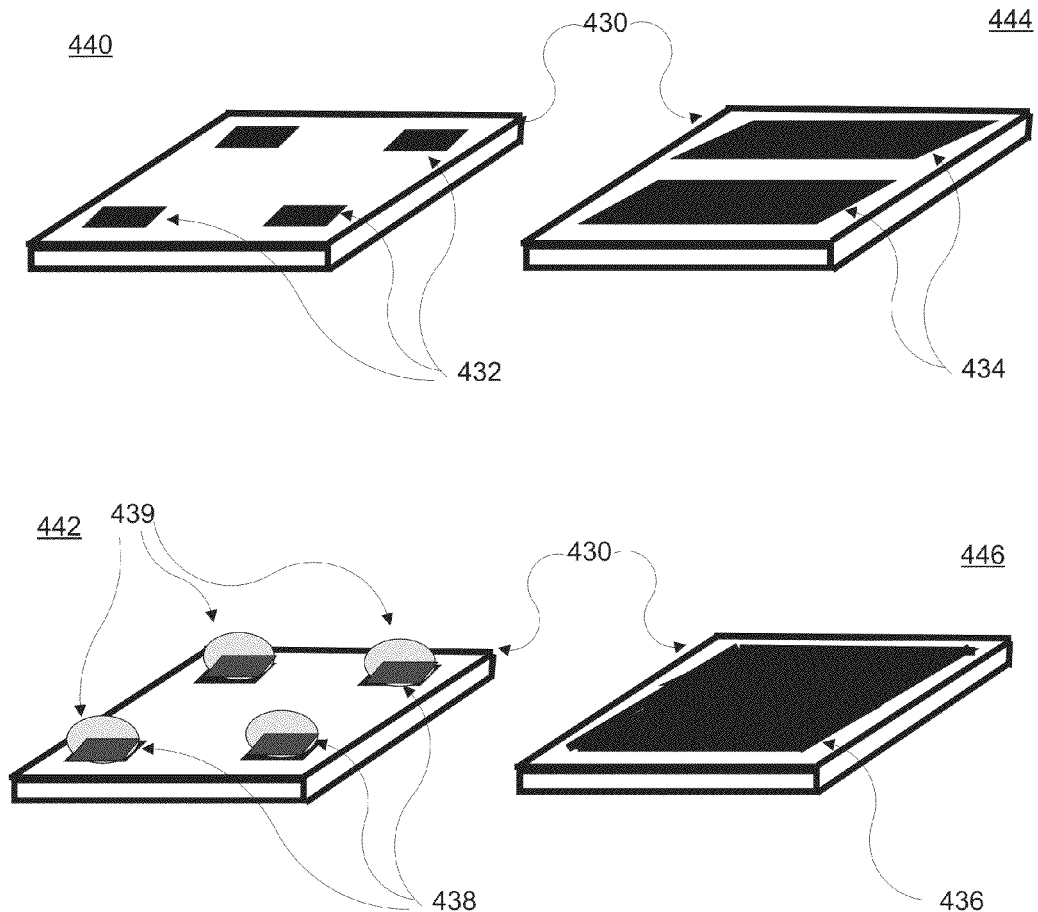
FIG. 4 illustrates different IC contact pad configurations according to embodiments.

FIG. 4 illustrates different IC contact pad configurations according to embodiments. In configuration 440, IC 430 has four contact pads (432), which may be openings in a passivation layer covering a metal layer on IC 430. Configuration 442 shows the same IC configuration with bumps (e.g. gold bumps) 439 added during a post-processing step and antenna pads 438 over the bumps. The bumps 439 may be added for alignment purposes (as discussed above) and to allow external contact to the contact pads 432, which may be recessed within the covering passivation layer.

To address some of the disadvantages of bump addition and IC-antenna alignment described above, one or more relatively large contact pads (e.g. 434, 436) may be formed on a top surface of the IC 430 instead of small contact pads 432, as shown in configurations 444 and 446. These large contact pads form a top layer of the IC and provide a capacitive or galvanic coupling mechanism to the tag antenna. Large contact pads provide more area for coupling to a tag antenna, and as a result, reduce parasitic capacitances and the need for accurate alignment. The large contact pads may cover a significant portion of the top surface of the IC 430. For example, the large contact pads may cover more than 20%, 30%, 40%, 50%, 60%, 70%, 80%, 90%, or even up to 100% of the top surface of the IC 430. In some embodiments, the large contact pads 434/436 may be formed on a dielectric or repassivation layer on the IC 430 and then electrically connected to contact pads below the dielectric repassivation layer (e.g., contact pads 432). While the particular large contact pads 434/436 in FIG. 4 are shown as substantially rectangular, large contact pads do not need to be rectangular, and may have any suitable shape. For example, a large contact pad may be circular or annular.

When using large contact pads for capacitive connections to antennas, the capacitance between the large contact pads and the antenna traces may be controlled by adjusting the dielectric characteristics (e.g. composition, thickness) of material disposed between the IC and the antenna, such as non-conductive material covering the pads, non-conductive material covering the antenna traces (e.g. a naturally grown or enhanced oxide layer on aluminum traces), and/or any additional dielectric material. Galvanic connections may also be provided by pressing an antenna onto the IC such that one or more "dimples" formed on the antenna traces make direct contact with one or more large contact pads on the IC. In some embodiments, as described below, galvanic connections may also or instead be accomplished without dimples, bumps, or other raised regions.

Figure 5:
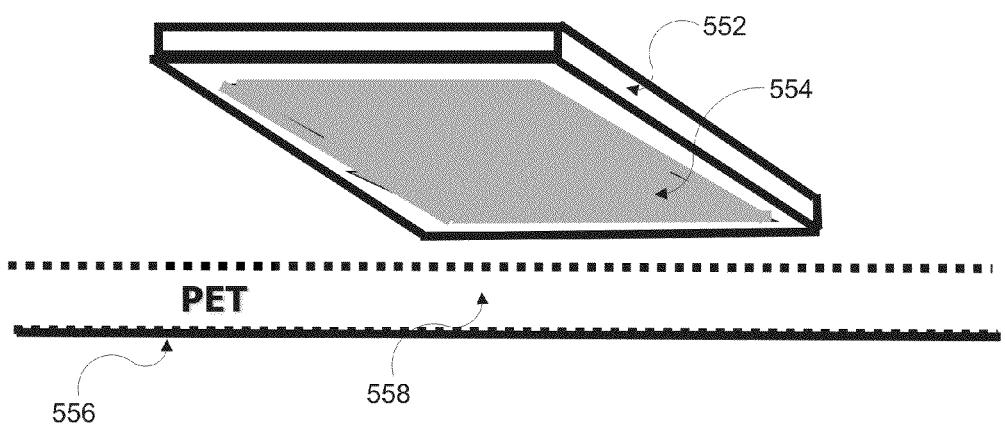
FIG. 5 illustrates an example capacitively-coupled inlay construction.

FIG. 5 illustrates an example capacitively-coupled inlay construction. IC 552 in diagram 500 is shown with a single large contact pad 554. While the large contact pad(s) according to preferred embodiments cover a substantial portion of the IC surface, embodiments are not so limited, and larger or smaller pads may also be implemented using the principles described herein. In some embodiments, the combined area of all contact pads on a particular surface of the IC does not exceed the area of that particular surface, and any contact pads on that surface are confined within or extend up to that surface's perimeter. Of course, in other embodiments, contact pads may extend out beyond the perimeter of an IC surface. For example, contact pads may wrap around or encroach onto neighboring IC surfaces, or even extend outward from the IC surface in a cantilevered fashion.

First, a tag antenna may be formed by depositing a conductive antenna trace pattern 556 on a dielectric 558 such as polyethylene terephthalate (PET). Other dielectric materials may also be used, including but not limited to Mylar, polypropylene (PP), polystyrene (PS), polyester, polyimide (PI), or vinyl. The IC and the antenna may then be brought into proximity to form a capacitive connection. For example, the IC may be heated to the plasticity temperature of dielectric 558, and then subsequently pressed into the dielectric to achieve a predefined thickness between pad 554 and antenna traces 556 (within given tolerances).

Thus, a method of tag assembly according to one embodiment includes affixing the antenna to the IC by forming at least one capacitor having a dielectric material and coupling the antenna to the IC. The dielectric material may include an IC covering layer, an antenna covering layer, and/or other dielectric layers. The covering layers may include a non-conductive layer disposed over an IC top metal layer (e.g., the large contact pads), an antenna dielectric layer (e.g., a naturally-occurring or grown metal oxide or nitride layer, for metallic antennas). Other dielectric layers may include adhesive materials with controllable dielectric characteristics. The thickness of the dielectric material may vary depending on the dielectric characteristics of the material and a desired minimum capacitance, and in some embodiments may be between 5 nm to 1 µm, inclusive.

As discussed above, in some embodiments large contact pad(s) on an IC surface may substantially cover the entire IC surface. In cases where multiple large contact pads exist, multiple capacitors may be formed, where each distinct capacitor may be coupled to distinct electrical circuits of the IC such as a rectifier circuit, a demodulator circuit, or a modulator circuit, thus enabling these circuits to be at different DC potentials. According to other embodiments, another antenna terminal may be affixed to a second surface of the IC (opposite the first surface) forming another capacitor (or set of capacitors) on the surface of the chip. In cases with multiple capacitors (and/or two-sided coupling), one or more connections may be galvanic by providing a direct contact between the antenna trace and one or more large contact pads on the IC.

Figure 6:
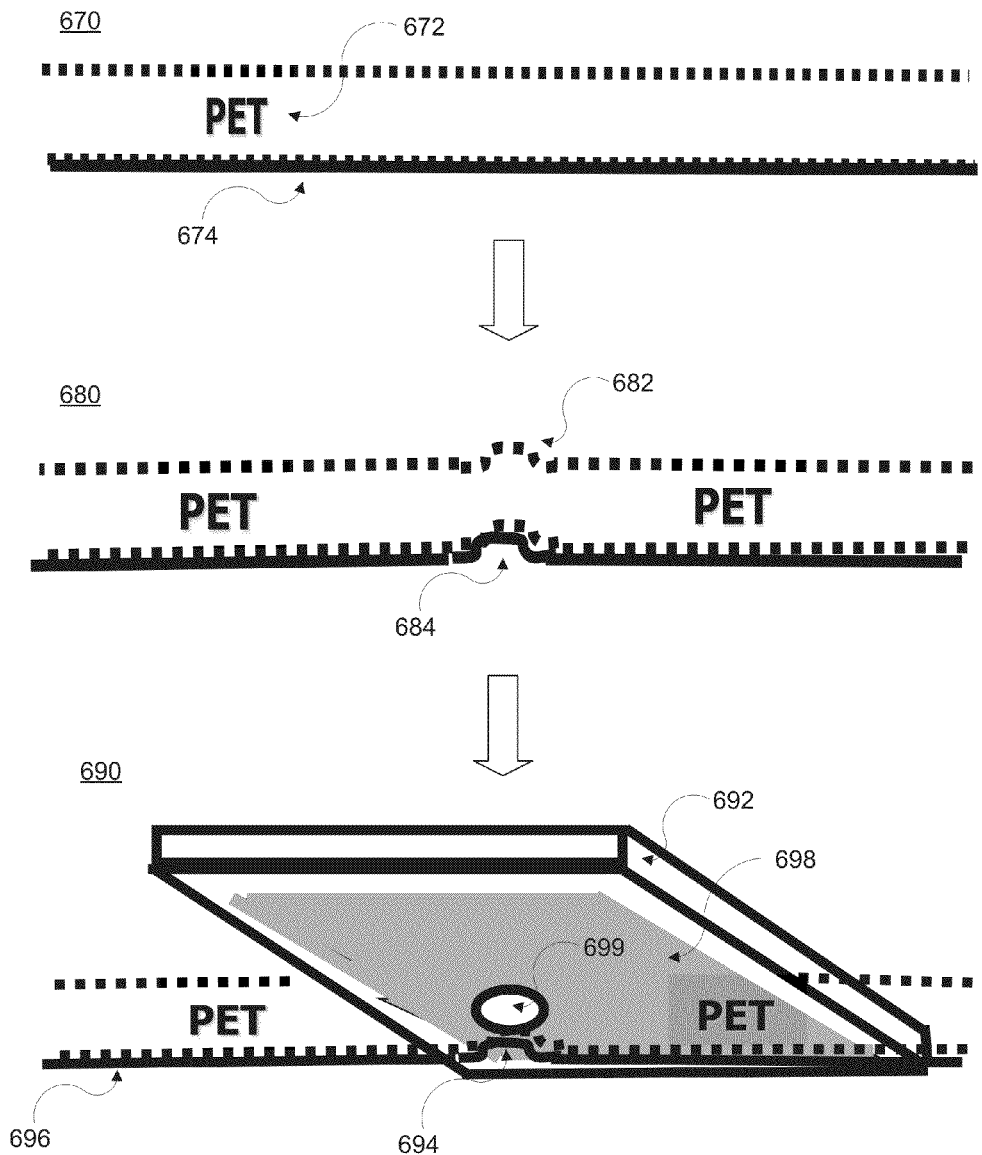
FIG. 6 illustrates an example galvanically-coupled inlay construction.

FIG. 6 illustrates an example galvanically-connected inlay construction. First, an antenna may be formed by depositing a conductive pattern 674 on a surface of a non-conductive material such as PET 672 as shown in diagram 670. Subsequently (e.g. following an embossing process), a small dimple (e.g. approximately 30 µm in diameter) 684 may be placed on the conductive pattern 674, which typically results in a similar dimple on the PET material as well (682) as shown in diagram 680. An IC 692 with a large contact pad 698 may then be pressed onto the antenna (e.g., as described above in relation to FIG. 5) as shown in diagram 690, to form a galvanic connection between the antenna 696 and the large contact pad 698 at location 699.

Figure 7:
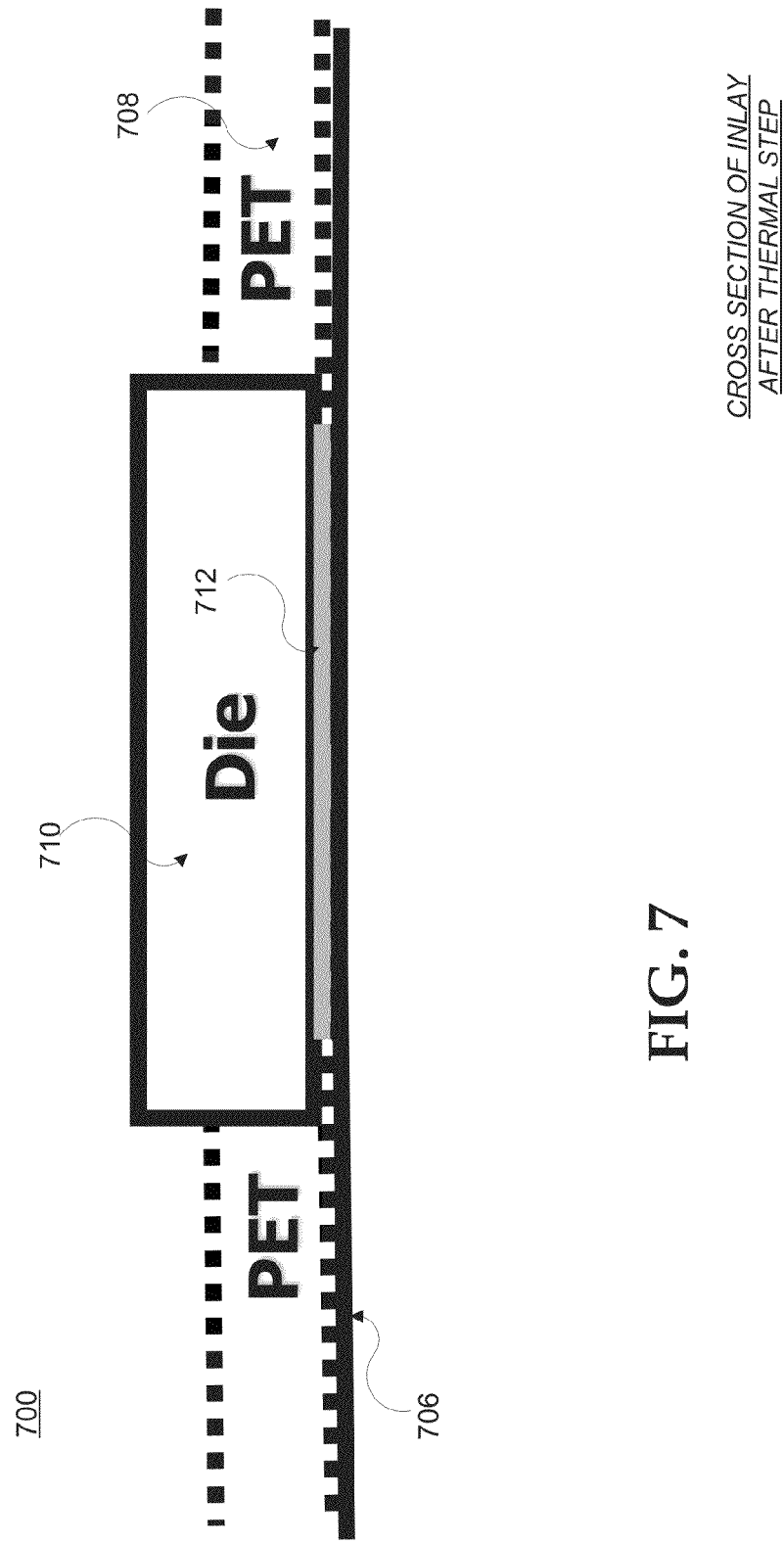
FIG. 7 illustrates a cross section of a capacitively-coupled inlay following a thermal bonding step according to embodiments.

FIG. 7 illustrates a cross section of a capacitively-coupled inlay following a thermal bonding step according to embodiments.

As shown in diagram 700, an example tag assembly includes an IC 710 inserted into dielectric (e.g. PET) 708 covering an antenna 706. Electrical coupling between IC 710 and antenna 706 is provided by one or more capacitors formed between large contact pad(s) disposed on the surface of IC 710 and antenna 706. The dielectric of the capacitor may include a portion of dielectric 708, any non-conductive covering layer of IC 710, and/or an additional dielectric layer 712 between the IC 710 and the antenna 706. In some embodiments, additional dielectric layer 712 may include a naturally occurring or artificially grown oxide layer of antenna 706, an adhesive dielectric material, or other materials.

According to some embodiments an IC may not be directly coupled to the antenna, but rather coupled through an interposer layer. For example, a strap may be capacitively coupled to the IC as discussed above and the antenna later electrically coupled to the strap. Thus, the tag assembly may include additional connection layers between the antenna and the IC using the principles described herein.

In other embodiments, affixing the antenna to the IC may include performing an IC metal deposition and patterning process, subsequently depositing a passivation material comprising the dielectric material, singulating the IC from a completed wafer, and pressing the antenna, the dielectric material, and the IC together. The dielectric material may include a material with a relatively high (e.g. >8) dielectric constant such as hafnium oxide, zirconium oxide, hafnium oxide silicate, zirconium oxide silicate, and strontium-titanium-oxide. Alternatively, the wafer process may be completed as is known in the art including the passivation deposition and pad opening etch, and then the IC singulated and pressed with the antenna and the dielectric material.

Figure 8:
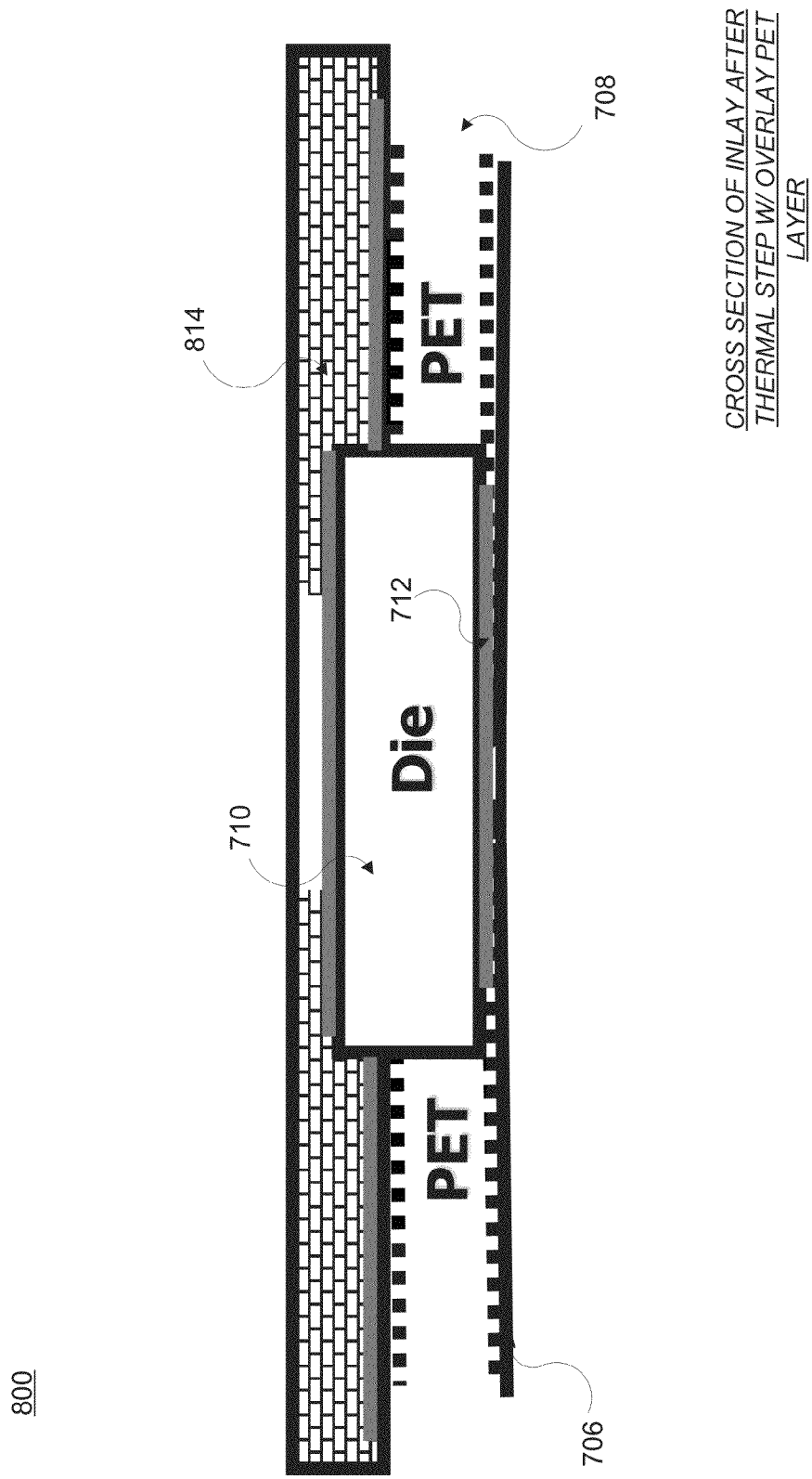
FIG. 8 illustrates the cross section of a capacitively-coupled inlay with an overlay PET layer for additional strength according to one embodiment.

FIG. 8 illustrates a cross section of a capacitively-coupled inlay with an overlay layer for additional strength according to one embodiment.

The example tag assembly shown in diagram 800 is similar to the tag assembly shown in FIG. 7 with the addition of an overlay layer 814 added for enhanced strength. The overlay 814 may include PET and/or any other suitable material, and may be affixed through adhesives or other means depending on the tag design and use. For example, the antenna layer may be disposed directly onto a host item, the IC then pressed onto the antenna layer as discussed and the overlay layer 814 placed over the IC and antenna layer. The overlay layer may also be configured to provide other functions, such as being a writeable label, and the like.

Figure 9:
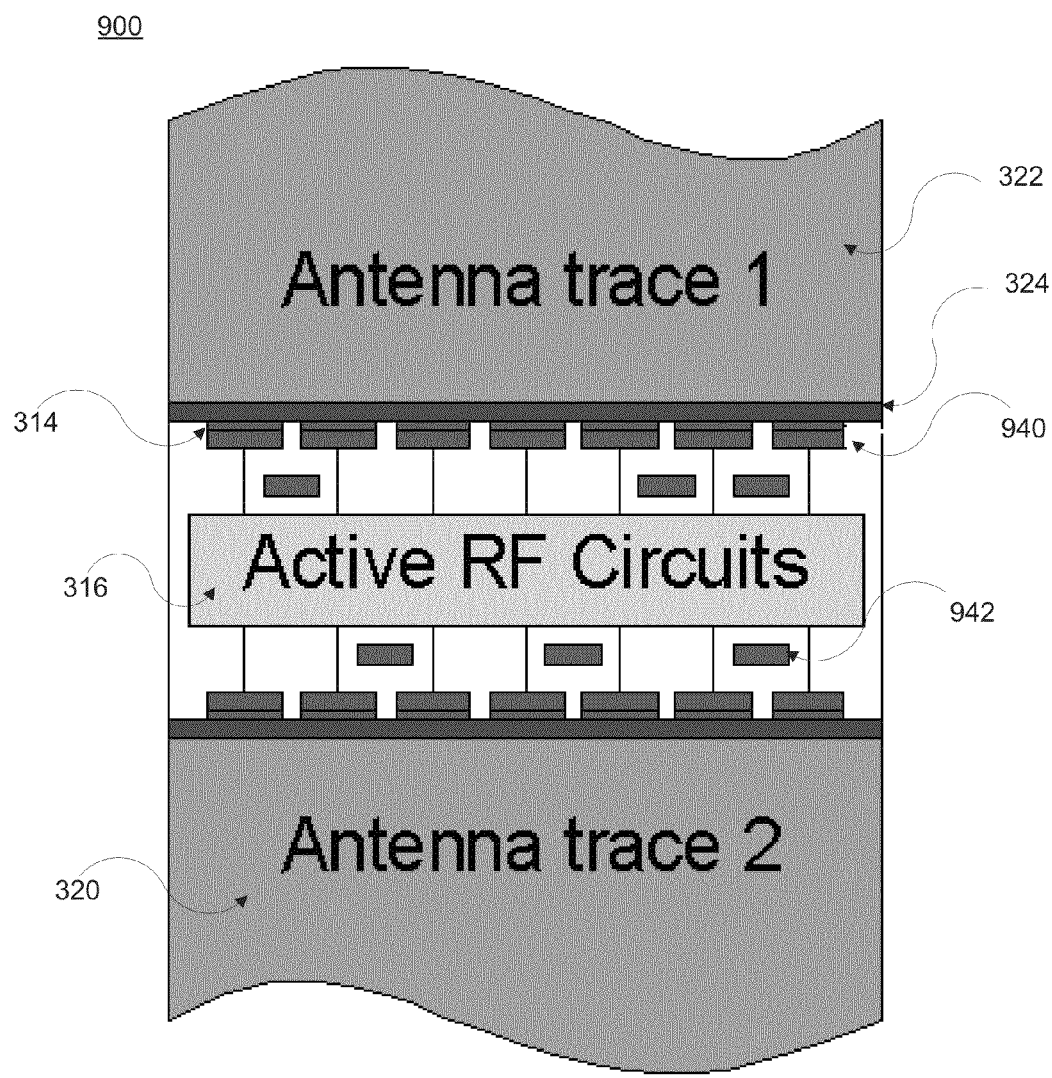
FIG. 9 illustrates a conceptual diagram of an assembled RFID tag similar to the diagram of FIG. 2 employing assembly methods according to embodiments.

FIG. 9 illustrates a conceptual diagram of an assembled RFID tag similar to the diagram of FIG. 3 employing assembly methods according to embodiments.

Diagram 900 illustrates differences between conventional tag assembly methods and tag assembly methods according to embodiments. By employing large contact pads 940 on an IC surface, capacitive coupling between antenna traces (320, 322) and active RF circuits 316 is achieved. This reduces parasitic capacitance between non-RF traces 942 and antenna traces 320/322. Furthermore, since no RF distribution bus is needed, RF distribution resistance is also eliminated.

The capacitors between the antenna traces and the IC circuits may include an oxide layer 324 of the antenna traces and/or a covering layer of the antenna/IC as dielectric material. The dielectric characteristics of these materials may be controlled through their composition and thickness (e.g. enhanced growth of the oxide layer, controlled thickness of the dielectric layer, etc.), enabling tag designers to set predefined capacitance values.

Mechanical limitations such as the use of gold-topped bumps, accurate alignment, and controlled mount force are also significantly reduced since the large contact pads may be implemented to be as large as the IC surface. This results in fewer assembly steps and increased reliability and throughput.

As described above in relation to FIG. 6, an IC may be galvanically or conductively connected to the conductive trace of an antenna by, for example, using a dimple on the trace to directly connect the trace to a large contact pad on the IC. In some embodiments, an IC contact pad may be galvanically connected to an antenna without the use of a dimple, bump, or raised region.

Figure 10A:
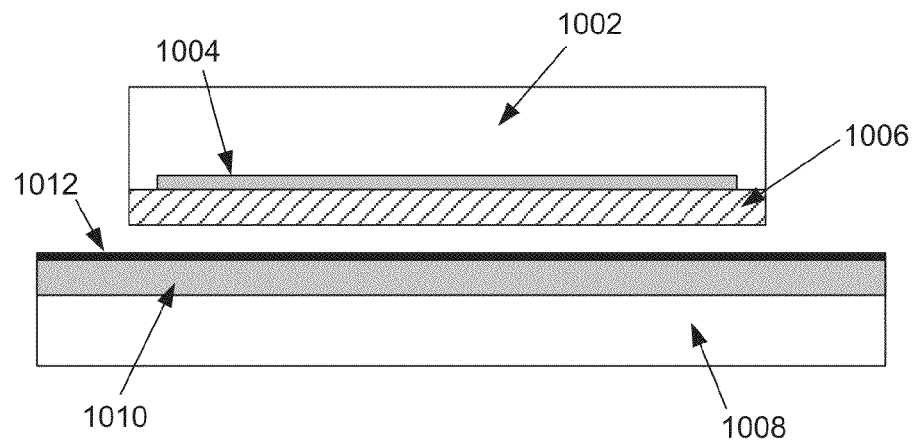
FIGS. 10A and 10B illustrate tag precursors having ICs galvanically connected to antenna terminals on tag substrates according to embodiments.
Figure 10B:
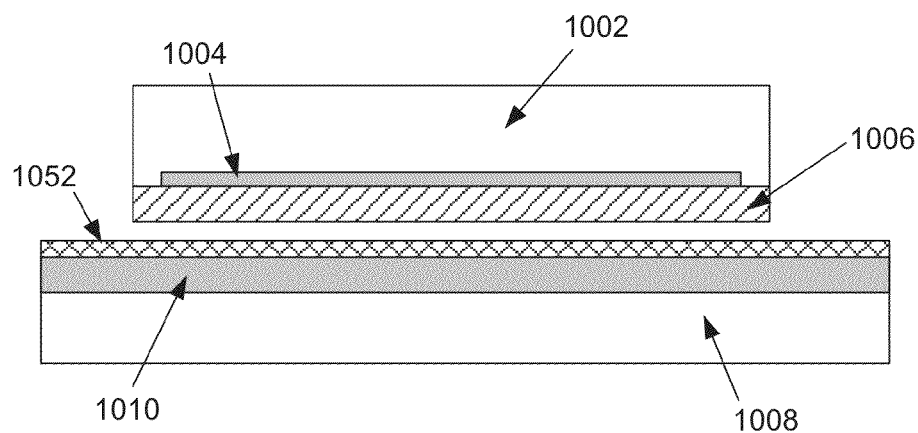

FIGS. 10A and 10B illustrate tag precursors having ICs galvanically connected to antenna terminals on tag substrates according to embodiments. A tag precursor is a portion of a complete RFID tag, and includes the RFID IC and either a substrate having the entire tag antenna (i.e., an inlay) or a substrate having only a portion of the entire tag antenna (i.e., a strap). In the latter case, the strap may then be attached to an inlay.

FIG. 10A depicts an IC 1002 and a tag substrate 1008. IC 1002 includes one or more large contact pads 1004, similar to pads 334 and 336 in FIG. 3, that electrically connect to one or more electrical circuit elements within IC 1002. Tag substrate 1008, which may be a strap or an inlay, includes an antenna terminal 1010, which may be a trace of metal similar to antenna traces 320 and 322 described in FIG. 3. If antenna terminal 1010 includes an oxidizing metal such as aluminum or copper, an oxide layer 1012 may form on terminal 1010, for example due to exposure to air. Oxide layer 1012, if allowed to remain, acts as an insulating layer which prevents the formation of a galvanic connection between IC pad 1004 and antenna terminal 1010.

To address this issue, an additional layer 1006 may be added to facilitate the formation of a galvanic connection between IC pad 1004 and antenna terminal 1010. In some embodiments, additional layer 1006 includes etchants for forming openings by etching or breaking through oxide layer 1012. For example, additional layer 1006 may include particles (spherical, ovoid, angular, sharp-edged, etc.) that form openings in the oxide layer 1012 by rupturing it when heat and/or pressure are applied. In one embodiment, particles suspended in a fast-drying binder or liquid may be applied to the IC 1002 or the substrate 1008 and then dried to form the additional layer 1006. Additional layer 1006 may also (or instead) include agent(s) for etching or reacting with oxide layer 1012 to form openings. For example, if antenna terminal 1010 includes aluminum, additional layer 1006 may include an etchant or solubilizing agent for aluminum oxide. When IC 1002 with additional layer 1006 is disposed on antenna terminal 1010, components in additional layer 1006 (e.g., the particles and/or agents described above) create openings in oxide layer 1012, thus allowing IC pad 1004 to form a galvanic connection with antenna terminal 1010.

In some embodiments, the additional layer 1006 may include an adhesive for attaching the IC 1002 to the tag substrate 1008. For example, the adhesive may include an isotropic or anisotropic conductive material and/or a nonconductive adhesive. In some embodiments, the adhesive may also include one or more of the mechanical and/or chemical etchants or reactants described herein (e.g., particles, etchants, solubilizing agents, dopants, etc.), while in other embodiments the adhesive may be separate from the etchant(s).

If the additional layer 1006 is electrically conductive, the galvanic connection between IC pad 1004 and antenna terminal 1010 may be formed through the additional layer 1006. For example, if the additional layer 1006 includes conductive particles for forming openings in the oxide layer 1012, the conductive particles may help form the galvanic connection. If the additional layer 1006 is not electrically conductive, it may be removed as a result of applied heat, pressure, or other processing, thus allowing IC pad 1004 to directly contact antenna terminal 1010 to form a galvanic connection (e.g., after applying pressure, heat, or some other processing). In some embodiments, the IC pad 1004 itself may have a textured surface (e.g., surface irregularities, ridges, protrusions, and/or other topological features) for etching or rupturing oxide layer 1012 when heat and/or pressure is applied. For example, the IC pad 1004 may be fabricated to include relatively sharp-edged ridges or bumps on its surface in a patterned or random arrangement. In some embodiments, laser-assisted etching or other methods of selective etching may be used to provide surface texturing on the IC pad 1004.

FIG. 10B depicts a diagram 1050 similar to diagram 1000 in FIG. 10A. However, instead of an oxide layer, a masking layer 1052 covers antenna terminal 1010. Masking layer 1052 may be deposited after antenna terminal 1010 is formed to serve as a protective layer that prevents the formation of an oxide layer on the antenna terminal. The masking layer 1052 may include an organic or inorganic dielectric material, or may even include a metallic or other electrically-conductive material that preferably does not oxidize. If masking layer 1052 includes a dielectric or insulating material, additional layer 1006 may include agent(s) for reacting with, etching, or solubilizing masking layer 1052 and/or particles that rupture masking layer 1052 when heat and/or pressure is applied. If masking layer 1052 includes an electrically-conductive material, additional layer 1006 may include material for galvanically connecting IC pad 1004 and masking layer 1052, or may not even be present.

While heat and/or pressure applied to an IC or a tag substrate may be used to form a galvanic connection (e.g., as described previously), in some embodiments processing other than heat and/or pressure may also be used to form a galvanic connection between IC pad 1004 and antenna terminal 1010. For example, an electric field may be applied between IC pad 1004 and antenna terminal 1010. The electric field may facilitate etching of any oxide layer (e.g., oxide layer 1012) by, for example, increasing the etching rate and/or the etching selectivity. The electric field may also facilitate the physical formation of the galvanic connection between IC pad 1004 and antenna terminal 1010 by, for example, electronically welding the pad to the terminal or promoting electromigration of metallic ions such that pad 1004 is electrically shorted to terminal 1010. As another example, ultrasonic welding may be used to disrupt oxide layer 1012 and/or short pad 1004 to terminal 1010.

In some embodiments, reactants or agents in the additional layer 1006 may react with the oxide layer 1012 or the masking layer 1052 to form a conductive pathway between IC pad 1004 and antenna terminal 1010 without having to form openings in the oxide layer 1012 or the masking layer 1052. For example, the masking layer 1052 may include a nonconductive plastic. When the additional layer 1006 is in contact with the masking layer 1052, dopants in the layer 1006 may diffuse into portions of the masking layer 1052, turning those portions conductive and creating the conductive pathway. In some embodiments, heat and/or pressure may be used to facilitate the diffusion/reaction.

In some embodiments an IC may include a nonconductive repassivation layer. The repassivation layer may cover a surface of the IC, be disposed between the IC and a substrate (e.g., additional dielectric layer 712 in FIG. 7), or be disposed between antenna contact pads and the rest of the IC, as depicted below in FIG. 11. The repassivation layer may aid in mitigating mounting capacitance variations due to varying mounting forces, and may also reduce parasitic capacitive coupling between large antenna contact pads and other IC circuit components. In some embodiments, a repassivation layer is confined within and/or extends up to the perimeter of the IC surface on which it is disposed. However, in other embodiments, the repassivation layer may extend beyond the IC surface perimeter. For example, the repassivation layer may wrap around or encroach onto one or more neighboring surfaces of the IC, or may extend out from the IC surface in a cantilevered fashion.

Figure 11:
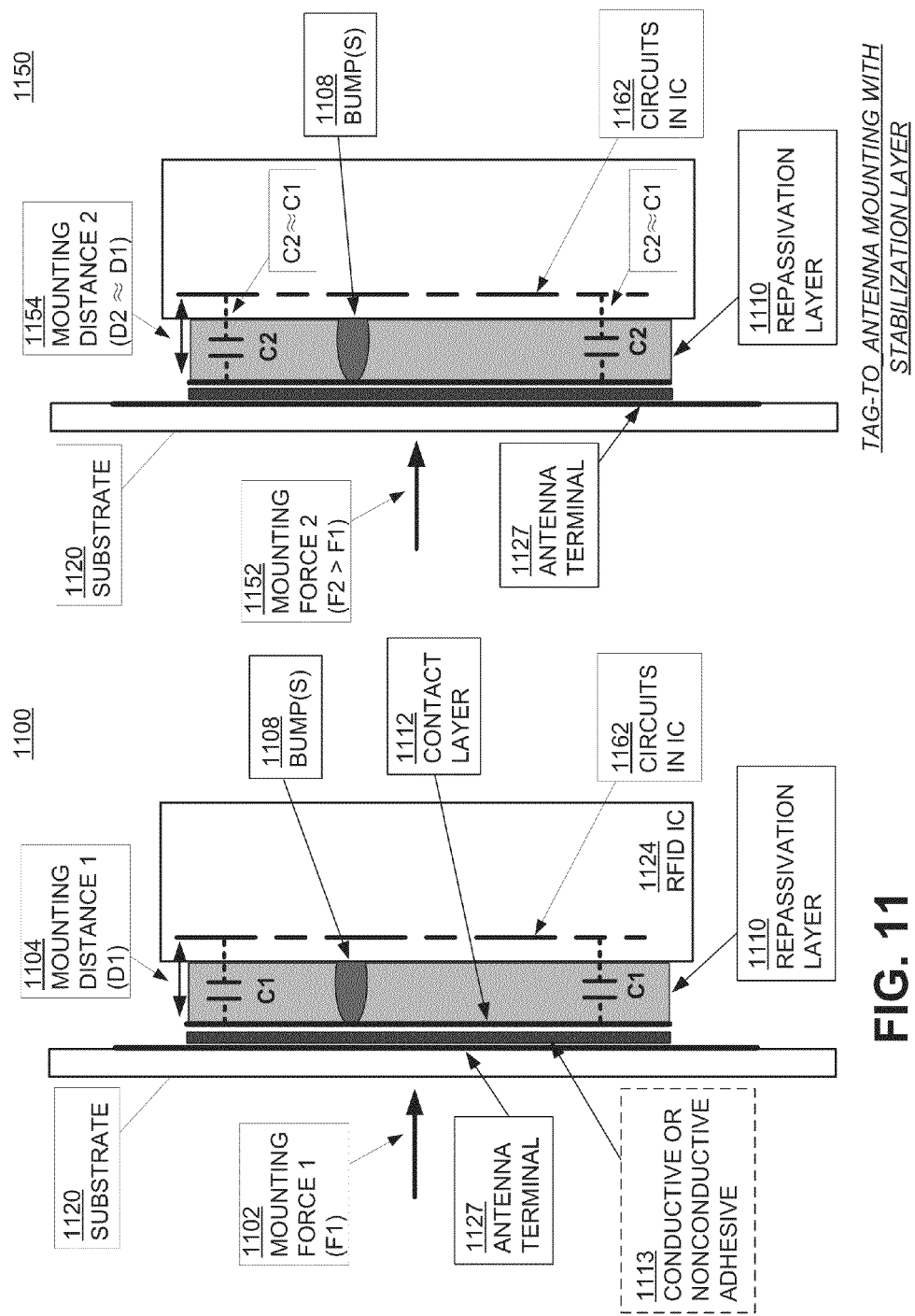
FIG. 11 depicts repassivation layers on an IC according to embodiments.

FIG. 11 shows a diagram 1100 in which an RFID strap or inlay comprising substrate 1120 and antenna terminal 1127 is pressed against RFID IC 1124 with a mounting force F1 (1102), where antenna terminal 1127 and contact layer 1112 are separated from the IC by repassivation layer 1110. Mounting distance D1 (1104) is fixed by repassivation layer 1110, producing a similarly fixed mounting capacitance C1.

In some embodiments contact layer 1112, similar to contact pads 434 or 436 in FIG. 4, substantially covers a large portion of the surface of RFID IC 1124. The contact layer 1112 may include a conductive material, such as a metal or other material that is electrically conductive or possesses metallic properties. In some embodiments, the contact layer 1112 may be formed from a conductive redistribution layer applied or deposited on the repassivation layer 1110. The conductive redistribution layer may be applied by evaporation, sputtering, or direct transfer. In some embodiments, the conductive redistribution layer may then be patterned (e.g., to form contact pads, strips, or any desired contact shape) to form the contact layer 1112. For example, evaporation or sputtering of the redistribution layer may be accompanied with a masking step to define a desired contact pattern (e.g., with photoresist) and an etching step (if masking occurs after layer deposition) or a liftoff/removal step (if masking occurs before layer deposition). In some embodiments, the contact layer 1112 may be applied to another substrate, patterned, and then transferred to the IC. While one contact layer 1112 is depicted in FIG. 11, in other embodiments more than contact layer may be present, or the contact layer 1112 may include multiple portions. For example, the contact layer 1112 on the repassivation layer 1110 may be patterned to provide multiple contact areas, each electrically disconnected from each other.

As with the repassivation layer 1110, in some embodiments the contact layer 1112 is confined within and/or extends up to the perimeter of the repassivation layer 1110 and/or the IC surface upon which the repassivation layer 1110 is disposed. Of course, in other embodiments, the contact layer 1112 may extend out beyond the perimeter of the repassivation layer or IC surface. For example, contact layer 1112 may wrap around or encroach onto neighboring surfaces, or even extend outward from a surface in a cantilevered fashion.

Diagram 1150 shows the RFID strap or inlay being pressed against the RFID IC with a mounting force F2 (1152) which is larger than mounting force F1. The presence of repassivation layer 1110 ensures that mounting distance D2 (1154) is substantially the same as mounting distance D1 (1104) despite the larger mounting force F2. As a result, mounting capacitance C2 is substantially similar to mounting capacitance C1, helping ensure that the tags have similar tuning and therefore similar performance characteristics.

In some embodiments, bumps 1108 formed through openings in repassivation layer 1110 galvanically connect circuits 1162 to contact layer 1112. In other embodiments, bumps 1108 may not be present. In this case, circuits 1162 may either be capacitively or galvanically connected to contact layer 1112 through the repassivation layer 1110. For example, if no suitable conductive path exists through the repassivation layer 1110, circuits 1162 may capacitively connect to contact layer 1112. In some embodiments, the contact layer 1112 may be directly deposited on openings in the repassivation layer 1110, thus galvanically connecting to circuits 1162. In other embodiments, portions of the repassivation layer 1110 may be made conductive, as described above in relation to the oxide layer 1012/masking layer 1052 in FIGS. 10A-B, and galvanic connections between circuits 1162 and contact layer 1112 made through the conductive portions.

Repassivation layer 1110 may be an organic or inorganic material, typically (although not necessarily) with a relatively low dielectric constant and a reasonable thickness to provide small capacitance. An anisotropic conductive adhesive, patterned conductive adhesive, or nonconductive adhesive 1113 may optionally be applied between the IC and the strap/inlay to connect the IC to the strap/inlay, physically and/or electrically. If adhesive layer 1113 is nonconductive then it is typically sufficiently thin such that at the frequencies of RFID communications it provides a low-impedance capacitive path between antenna terminal 1127 and contact layer 1112.

In some embodiments, repassivation layer 1110 may include an air gap that separates contact layer 1112 from IC 1124 to further decouple the two capacitively. The air gap may be bridged by support pillar(s) between contact layer 1112 and IC 1124 (including bumps that electrically connect the two). In some embodiments, the contact layer 1112 may include a metallic or conductive mesh structure to facilitate the formation of the air gap.

The contact layer 1112, being a relatively large metallic pad, may also help to protect the underlying repassivation layer 1110 during IC fabrication. For example, contact layer 1112 may serve as an etch mask that covers and prevents etching or damage to underlying portions of repassivation layer 1110 during processing like that described in U.S. Pat. No. 7,482,251 issued on Jan. 27, 2009, the entirety of which is hereby incorporated by reference.

Figure 12:
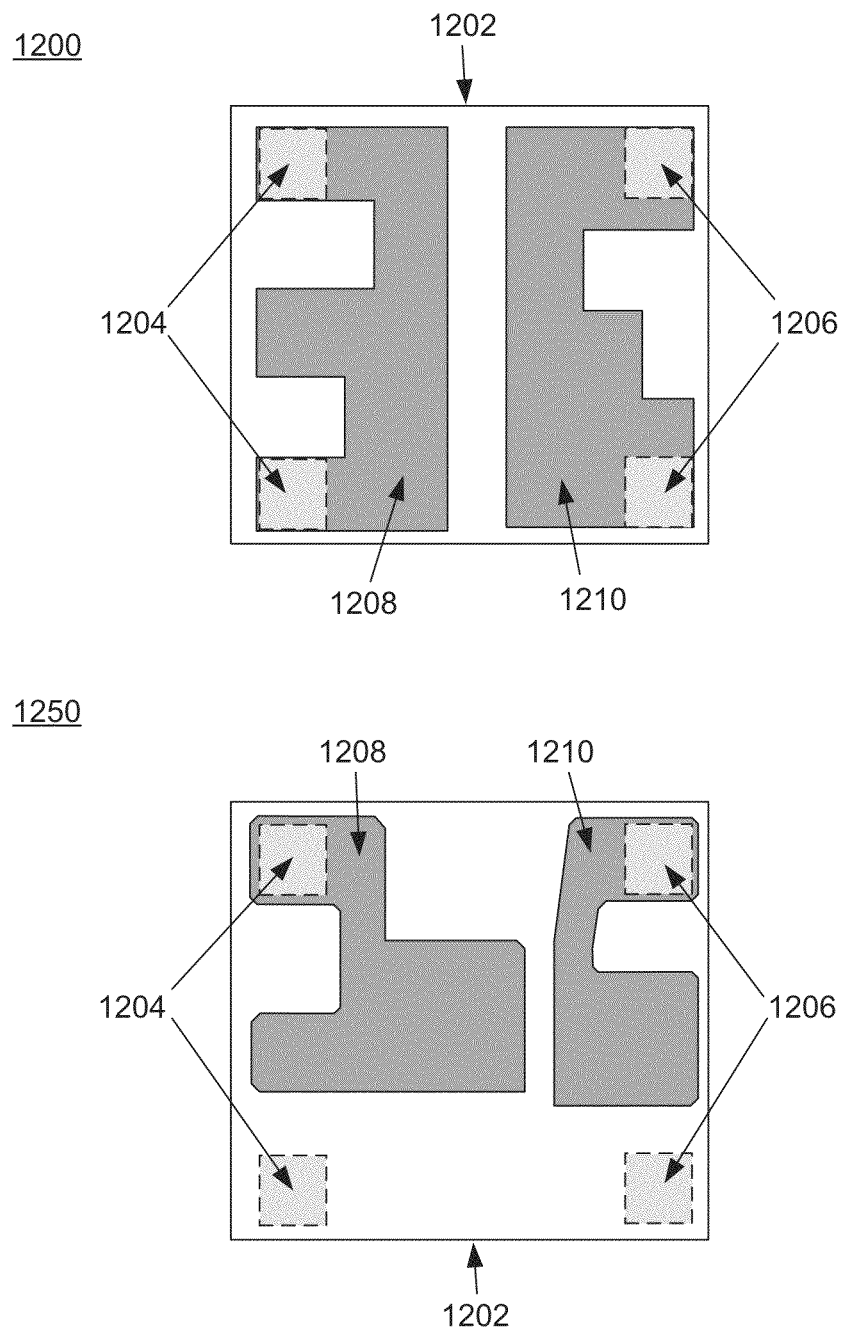
FIG. 12 depicts patterned contact areas according to embodiments.

As described above, in some embodiments a contact layer may include contact areas having different shapes. FIG. 12 depicts patterned contact areas according to embodiments. Diagram 1200 depicts a top view of an IC 1202 with IC contacts 1204 and 1206. The IC 1202 also has contact areas 1208 and 1210 which overlie and electrically connect to IC contact pairs 1204 and 1206, respectively. The contact areas 1208 and 1210 allow the IC contact pairs 1204 and 1206 to electrically connect to external electrical elements, such as antenna terminals on an RFID strap or inlay (e.g., antenna terminal 1127).

The contact areas 1208 and 1210 may be fabricated and shaped by patterning a deposited conductive redistribution layer as described above in reference to FIG. 11. The shapes and/or orientations of the contact areas may be based on aesthetics, ease of forming electrical connections to antenna terminals, and/or coupling to components in the IC 1202. For example, the contact areas 1208 and 1210 may be shaped to minimize parasitic capacitive coupling with sensitive elements within the IC 1202. In these cases, the conductive redistribution layer may be patterned such that portions of the redistribution layer whose local parasitic capacitance to the IC 1202 (or elements in the IC 1202) exceed a particular threshold are excised during the patterning process. For example, the portions may be removed after deposition using a mask-and-etch process or prevented from being depositing in the first place using a mask-and-liftoff process. The threshold(s) may be predefined prior to the patterning of the redistribution layer, and may be determined based on, for example, a desired parasitic capacitance of the entire IC or a desired local parasitic capacitance of a portion of the IC.

Diagram 1250 depicts a top view of another embodiment of IC 1202. In diagram 1250, only one contact from each of IC contact pair 1204 and 1206 may be electrically connected to the contact areas 1208 and 1210. For example, this may be done to reduce capacitance between the contact areas and the IC contact pairs. Also as shown in diagram 1250, the contact areas 1208 and 1210 may have curved or rounded edges. This may be done to ease the masking, etching, and/or liftoff patterning processes.

Figure 13:
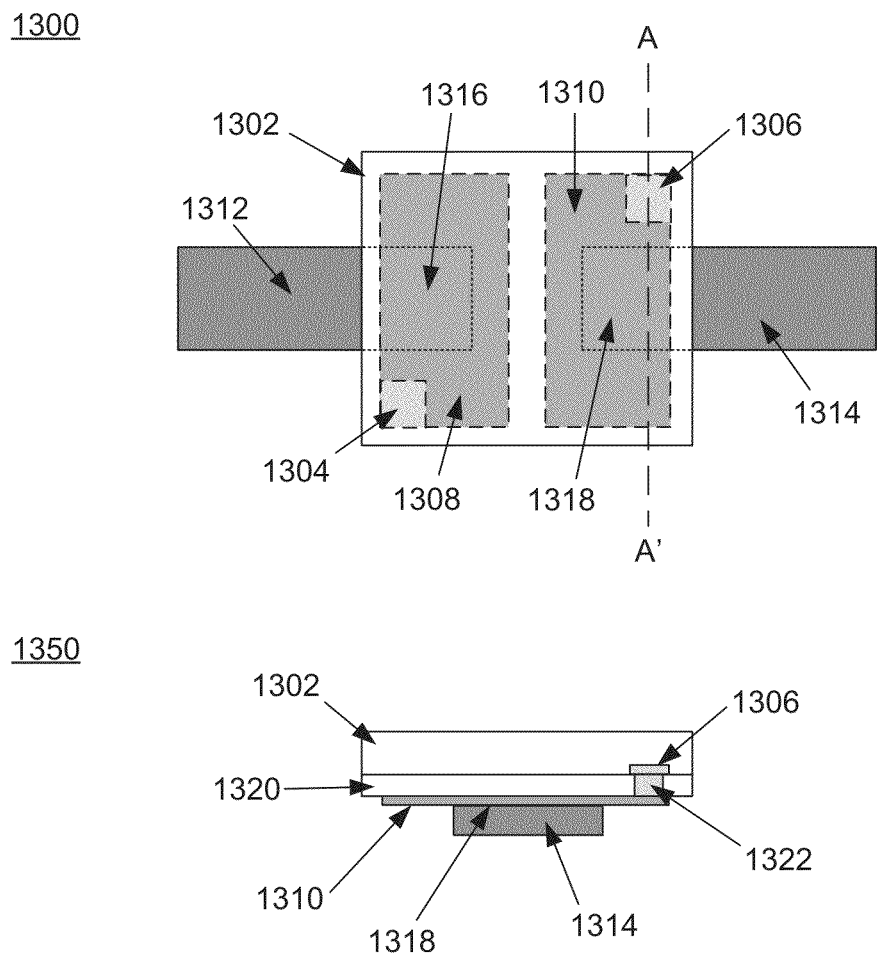
FIG. 13 depicts nonoverlapping or offset contacts according to embodiments.

In some embodiments, a contact location between a contact layer (e.g., contact layer 1112 or contact areas 1208/1210) and antenna terminal (e.g., antenna terminal 1127) may differ from a contact location between the contact layer and the IC (e.g., bump(s) 1108). FIG. 13 depicts nonoverlapping or offset contacts according to embodiments, and depicts a top view 1300 and a cutaway view 1350 (taken along the A-A' axis shown in view 1300). In FIG. 13, an IC 1302 has IC contacts 1304 and 1306. A repassivation layer 1320 is disposed over the IC contacts 1304 and 1306, and contact pads 1308 and 1310 are disposed on the repassivation layer 1320. The contact pads 1308 and 1310 may be formed by patterning a deposited contact layer, as described above. The IC contacts 1304 and 1306 are electrically connected through the repassivation layer 1320 to the contact pads 1308 and 1310, respectively. As shown in view 1350, IC contact 1306 may be electrically connected to contact pad 1310 via a bump 1322 (similar to bump 1108) formed through an opening in the repassivation layer 1320. A similar bump (not shown) may electrically connect IC contact 1304 to contact pad 1308 through another opening in the repassivation layer 1320. In some embodiments, the contact pads 1310 and 1308 may directly electrically connect with the IC contacts 1306 and 1304, respectively, without bumps. For example, the contact pads 1310;1308 may be deposited on an opening in the repassivation layer 1320, directly forming an electrical connection with underlying IC contacts 1306/1304.

The contact pads 1308 and 1310 are further electrically connected to antenna terminals 1312 and 1314, respectively. In particular, contact pad 1308 electrically connects to antenna terminal 1312 through contact area 1316, and contact pad 1310 electrically connects to antenna terminal 1314 through contact area 1318. If an oxide, masking, or other nonconductive layer covers the contact pads and/or the antenna terminals, openings may be formed at the contact areas 1316 and 1318 before the electrical connections are made, as described above.

In some embodiments, contact pad/IC contact connections and contact pad/antenna terminal connections (and their respective openings in the repassivation layer and oxide/masking layer, if present) may be offset from each other and nonoverlapping, as shown in FIG. 13. This may provide flexibility in terms of the placement of the IC onto the antenna terminals. Of course, in other embodiments the connections/openings may partially overlap, or a connection (e.g., a contact pad/antenna terminal connection) may wholly encompass another connection (e.g., a contact pad/IC contact connection).

Figure 14:
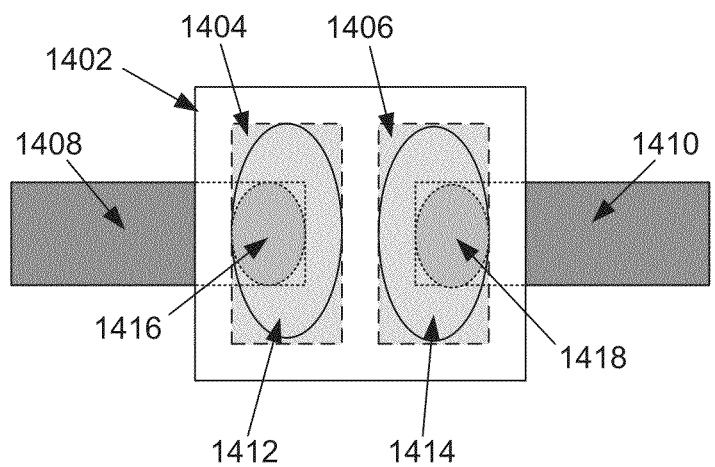
FIG. 14 illustrates a tag assembly method according to embodiments.
Figure 14:
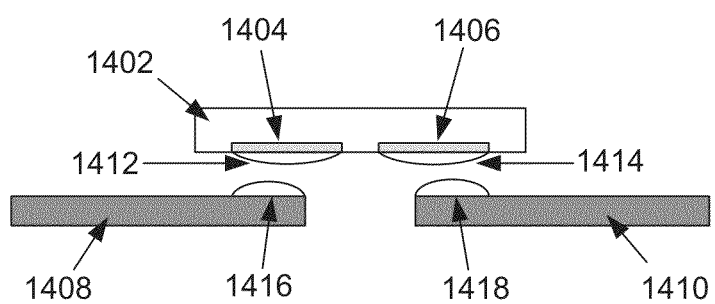

Large IC contact pads as described herein may also assist in the positioning of an IC on a substrate. FIG. 14 illustrates a top view 1400 and a side view 1450 of a tag self-assembly method according to embodiments. In FIG. 14, an IC 1402 is to be deposited on a substrate having antenna terminals 1408 and 1410. In particular, IC 1402 is to be deposited such that first IC contact pad 1404 overlaps first antenna terminal 1408 (but not second antenna terminal 1410) and second IC contact pad 1406 overlaps second antenna terminal 1410 (but not first antenna terminal 1408).

Liquid surface tension may be used to facilitate the alignment of each contact pad with its respective antenna terminal. Surface tension results from cohesive forces between liquid molecules. When two droplets of similar liquid (or liquids having similar surface energies) are placed close to each other, they will tend to coalesce into a single, larger droplet in order to minimize the number of exposed molecules and thereby minimize surface energy. If the two droplets are each associated with a different object, the coalescence of the two droplets may also pull the different objects together.

In FIG. 14, at least some of the contact pads and/or the antenna terminals may each be associated with a liquid droplet. For example, contact pad 1404 may be associated with droplet 1412, contact pad 1406 may be associated with droplet 1414, antenna terminal 1408 may be associated with droplet 1416, and antenna terminal 1410 may be associated with droplet 1418. When IC 1402 is brought into close proximity to the substrate (and antenna terminals 1408 and 1410), droplet 1412 may be attracted to droplet 1416, thus drawing IC pad 1404 into contact with antenna terminal 1408. Similarly, droplet 1414 may be attracted to droplet 1418, drawing IC pad 1406 into contact with antenna terminal 1410.

In one embodiment, the liquid droplets 1412-1418 may include water. In some embodiments, the liquid droplets may also include one or more liquid adhesives, such as a conductive, nonconductive, or anisotropically conductive adhesive. Liquid droplets 1412-1418 may result from solid material. For example, a solid film or solid particles may first be deposited on the contact pads and/or the antenna terminals. The deposited solid material may then be heated, chemically modified, or otherwise processed to form the liquid droplets 1412-1418. For example, solid solder may initially be deposited on the contact pads and/or the antenna terminals. Just prior to the assembly process, heat may be applied to IC 1402 and/or the substrate in order to melt the solid solder into liquid solder droplets. Subsequently, IC 1402 may be brought into close proximity to the substrate (and antenna terminals 1408 and 1410), and the liquid solder droplets on the IC contact pads and/or the antenna terminals may coalesce to draw the IC and the substrate together. In some embodiments, IC 1402 may be brought into close proximity to the substrate before heat is applied. Subsequently, heat may be applied to melt the solid solder deposited on the contact pads and/or the antenna terminals, which causes contact pads and antenna terminals close to each other to be drawn together (via droplet coalescence). Of course, solid materials other than solder may be used.

In some embodiments, different types of liquids may be used for each pair of IC pad and antenna terminal. For example, a first type of liquid may be placed on IC pad 1404 and antenna terminal 1408, and a second type of liquid may be placed on IC pad 1406 and antenna terminal 1410. The liquid types may be selected to have different surface tension properties, such that droplets of the first type of liquid do not attract droplets of the second type of liquid. For example, droplets of a polar liquid (e.g., water) may be placed on IC pad 1404 and antenna terminal 1408, and droplets of a nonpolar liquid (e.g., an oil) may be placed on IC pad 1406 and antenna terminal 1408. In some embodiments, substances that are liquid under different conditions may be used. For example, water droplets may be placed on IC pad 1404 and antenna terminal 1408, and solid solder may be placed on IC pad 1406 and antenna terminal 1410. When the IC is initially deposited on the substrate, IC pad 1404 and antenna terminal 1408 will be drawn together by their associated water droplets. Subsequently, the IC and substrate may be heated such that the solid solder on IC pad 1406 and antenna terminal 1410 melt and draw the pad and terminal together.

While FIG. 14 depicts liquid droplets on each of the IC pads and antenna terminals, in some embodiments liquid droplets may be present on only one IC pad or antenna terminal in each pair of IC pads and antenna terminals. In these embodiments, the liquid droplet on the IC pad (or antenna terminal) may be preferentially attracted to the material of the antenna terminal (or IC pad). For example, a droplet of a polar liquid (e.g., water) may be preferentially attracted to a metal (e.g., the metal of an IC pad or antenna terminal).

Other techniques may also be used to assemble or align ICs onto antenna terminals on a substrate. As one example, electrostatic attraction may be used to assemble an electrically-charged IC onto oppositely-charged antenna terminals. The charge on the IC and/or antenna terminals may be induced by a laser (e.g., as with laser printing) or by any other suitable means.

Figure 15A:
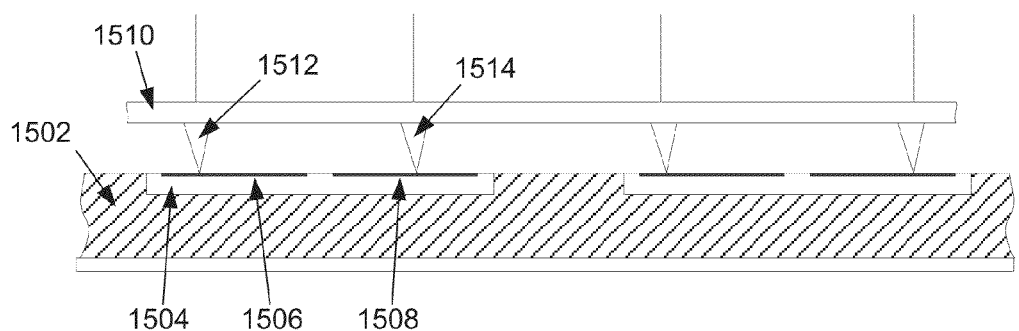
FIGS. 15A and 15B illustrate wafer-scale probe testing of ICs according to embodiments.
Figure 15B:
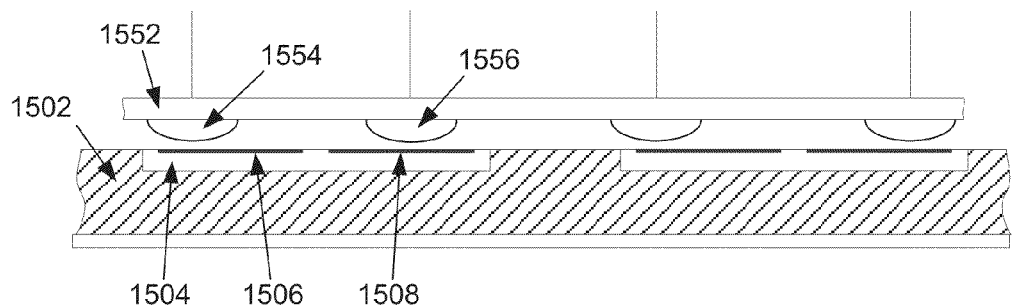

In addition to facilitating IC placement on substrates, large IC contact pads as described herein may also facilitate IC testing. FIGS. 15A and 15B illustrate wafer-scale probe testing of ICs according to embodiments. ICs on a wafer can be tested by using individual probes to contact individual IC contact pads. In some embodiments, multiple test probes are combined into a probe card, which serves as an interface between the test system and the wafer. In order to test ICs on a wafer, the probe card (or individual probes) must be carefully aligned with IC contact pads on the wafer. Large IC contact pads as described herein simplify the probe alignment process, because the precision required for probe alignment is lower with larger contact pads than with smaller contact pads.

FIG. 15A depicts a system 1500 for contacting a wafer 1502 for testing. The wafer 1502 includes multiple ICs, only one of which is labeled. IC 1504 includes two contact pads 1506 and 1508. A probe card 1510 includes multiple test probes, two of which are labeled 1512 and 1514. The test probes 1512 and 1514 are configured to test IC 1504 by forming electrical connections with contact pads 1506 and 1508, respectively. The relatively large size of the contact pads 1506 and 1508 allows the precision with which probe card 1510 is disposed on the wafer 1502 to be reduced, resulting in a reduction of the overall testing time.

FIG. 15B depicts a system 1550 similar to system 1500. In system 1550, probe card 1552 includes probes 1554 and 1556 that may be formed of a flexible, compliant, yet electrically-conductive material. The compliant nature of probes 1554 and 1556 may reduce damage to IC 1504 and/or wafer 1502 during testing, as well as improving the electrical connection between individual probes and contact pads. In some embodiments, probe card 1552 itself may also be formed of a compliant material, which may improve probe contact to IC contact pads across multiple ICs on the wafer.

FIG. 16 illustrates a method for assembling a Radio Frequency Identification (RFID) tag precursor according to embodiments. The method as shown in flowchart 1600 may include providing an assembly having an RFID integrated circuit (IC), a nonconductive repassivation layer on a surface of the IC and confined within a perimeter of the surface, and a conductive redistribution layer on the repassivation layer and confined within the perimeter of the surface, in which at least a first portion of the redistribution layer is electrically connected to the IC through a first opening in the repassivation layer" (operation 1610), followed by "providing a substrate having a first antenna terminal" (operation 1620). Operation 1620 may be followed by operation 1630 "forming a second opening in a nonconductive barrier present on at least one of the first antenna terminal and the first portion of the redistribution layer with an etchant, where the first opening and the second opening are nonoverlapping", which in turn may be followed by operation 1640 "attaching the assembly to the substrate with an adhesive". Operation 1640 may be followed by operation 1650 "forming a first electrical connection between the first antenna terminal and the first portion of the redistribution layer through the second opening".

ICs as described herein may also be configured and/or implement functionalities as described in Patent Cooperation Treaty (PCT) Application PCT/US12/54531, filed on Sep. 10, 2012. The disclosure of the aforementioned PCT application is hereby incorporated by reference for all purposes.

Embodiments also include methods of assembling a tag as described herein. An economy is achieved in the present document in that a single description is sometimes given for both methods according to embodiments, and functionalities of devices made according to embodiments.

Embodiments may be implemented using programs executed by fully or partially automated tag manufacturing equipment. A program is generally defined as a group of steps or operations leading to a desired result, due to the nature of the elements in the steps and their sequence. A program is usually advantageously implemented as a sequence of steps or operations for a processor, such as the structures described above.

Performing the steps, instructions, or operations of a program requires manipulation of physical quantities. Usually, though not necessarily, these quantities may be transferred, combined, compared, and otherwise manipulated or processed according to the steps or instructions, and they may also be stored in a computer-readable medium. These quantities include, for example, electrical, magnetic, and electromagnetic charges or particles, states of matter and in the more general case can include the states of any physical devices or elements.

Embodiments may furthermore include storage media for storing the programs discussed above. A storage medium according to the embodiments is a machine-readable medium, such as a memory, and is read by a processor controlling a tag assembly machine for assembling tags according to embodiments. If a memory, it can be implemented in a number of ways, such as Read Only Memory (ROM), Random Access Memory (RAM), etc., some of which are volatile and some non-volatile.

According to some examples, a Radio Frequency Identification (RFID) tag precursor may include an assembly having an RFID integrated circuit (IC), a nonconductive repassivation layer on a surface of the IC and confined within a perimeter of the surface, and a conductive redistribution layer on the repassivation layer and confined within the perimeter of the surface. A first portion of the redistribution layer may be electrically connected to the IC through a first opening in the repassivation layer.

The RFID tag precursor may also include a substrate having a first antenna terminal, an etchant forming a second opening in a nonconductive barrier present on the first antenna terminal and/or the first portion of the redistribution layer, and an adhesive attaching the assembly to the substrate. A first electrical connection may be formed between the first antenna terminal and the first portion of the redistribution layer through the second opening, and the first opening and the second opening may be nonoverlapping.

According to another example, a method for assembling an RFID tag precursor may include providing an assembly having an RFID IC, a nonconductive repassivation layer on a surface of the IC and confined within a perimeter of the surface, and a conductive redistribution layer on the repassivation layer and confined within the perimeter of the surface. A first portion of the redistribution layer may be electrically connected to the IC through a first opening in the repassivation layer.

The method may further include providing a substrate having a first antenna terminal, forming a second opening in a nonconductive barrier present on the first antenna terminal and/or the first portion of the redistribution layer with an etchant, where the first and second openings are nonoverlapping, attaching the assembly to the substrate with an adhesive, and forming a first electrical connection between the first antenna terminal and the first portion of the redistribution layer through the second opening.

According to yet another example, a Radio Frequency Identification (RFID) tag precursor may include an assembly having an RFID integrated circuit (IC), a nonconductive repassivation layer on a surface of the IC and confined within a perimeter of the surface, and a conductive redistribution layer on the repassivation layer and confined within the perimeter of the surface. A first portion of the redistribution layer may be electrically connected to the IC through a first opening in the repassivation layer.

The RFID tag precursor may also include a substrate having a first antenna terminal, a reactant reacting with a portion of a nonconductive barrier present on the first antenna terminal and/or the first portion of the redistribution layer, and an adhesive attaching the assembly to the substrate. The reacted portion of the nonconductive barrier may be conductive, and a first electrical connection may be formed between the first antenna terminal and the first portion of the redistribution layer through the reacted portion.

According to some embodiments, the redistribution layer may be patterned such that portions that have a local parasitic capacitance to the IC that exceeds a predefined threshold are excised. The nonconductive barrier may be an oxide or a masking layer. The adhesive may include an anisotropic or isotropic conductive material, and the first electrical connection may include the adhesive. The etchant may include a textured surface on the redistribution layer and/or conductive particles that forms the second opening by breaking the nonconductive barrier. The etchant may form the second opening by reacting with the nonconductive barrier. In some embodiments, the substrate may also include a second antenna terminal, the redistribution layer may include a second portion electrically isolated from the first portion and electrically connected to the IC, the nonconductive barrier may be present on the second antenna terminal and/or the second portion of the redistribution layer, the etchant may form a third opening in the nonconductive barrier, and a second electrical connection may be formed between the second antenna terminal and the second portion of the redistribution layer through the third opening.

The above specification, examples and data provide a complete description of the manufacture and use of the composition of the embodiments. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and embodiments.

We claim:

1. A method for assembling a Radio Frequency Identification (RFID) tag precursor, the method comprising:
   providing an assembly having an RFID integrated circuit (IC), a nonconductive repassivation layer on a surface of the IC and confined within a perimeter of the surface, and a conductive redistribution layer on the repassivation layer and confined within the perimeter of the surface, in which at least a first portion of the redistribution layer is electrically connected to the IC through a first opening in the repassivation layer;
   providing a substrate having a first antenna terminal;
   forming a second opening in a nonconductive barrier present on at least one of the first antenna terminal and the first portion of the redistribution layer with an etchant, where the first opening and the second opening are nonoverlapping;
   attaching the assembly to the substrate with an adhesive; and
   forming a first electrical connection between the first antenna terminal and the first portion of the redistribution layer through the second opening.

2. The method of claim 1, in which the redistribution layer is patterned such that portions that have a local parasitic capacitance to the IC that exceeds a threshold are excised.

3. The method of claim 1, wherein the nonconductive barrier is at least one of an oxide and a masking layer.

4. The method of claim 1, wherein the adhesive includes at least one of an anisotropic conductive material and an isotropic conductive material, and the first electrical connection includes the adhesive.

5. The method of claim 1, wherein the etchant is a textured surface on the redistribution layer and the method further comprises forming the second opening by breaking the nonconductive barrier with the etchant.

6. The method of claim 1, wherein the etchant includes conductive particles and the method further comprises forming the second opening by breaking the nonconductive barrier with the conductive particles.

7. The method of claim 1, further comprising forming the second opening by reacting the etchant with the nonconductive barrier.

8. The method of claim 1, further comprising forming the first electrical connection by using at least one of an applied electric field, electronic welding, and ultrasonic welding.

9. The method of claim 1, wherein:
the substrate further includes a second antenna terminal;
the redistribution layer further includes a second portion electrically isolated from the first portion and electrically connected to the IC, and
the nonconductive barrier is further present on at least one of the second antenna terminal and the second portion of the redistribution layer; and
the method further comprises:
forming a third opening in the nonconductive barrier with the etchant; and
forming a second electrical connection between the second antenna terminal and the second portion of the redistribution layer through the third opening.

* * * * *

UNITED STATES PATENT AND TRADEMARK OFFICE
CERTIFICATE OF CORRECTION

| | | |
|---|---|---|
| PATENT NO. | : 8,881,373 B1 | Page 1 of 1 |
| APPLICATION NO. | : 13/776346 | |
| DATED | : November 11, 2014 | |
| INVENTOR(S) | : Koepp et al. | |

It is certified that error appears in the above-identified patent and that said Letters Patent is hereby corrected as shown below:

In the Specification,

In Column 4, Line 38, Delete "3/20;322." and insert -- 320/322. --, therefor.

In Column 12, Line 9, Delete "1/310;1308" and insert -- 1310/1308 --, therefor.

In Column 14, Line 30, Delete "providing" and insert -- "providing --, therefor.

Signed and Sealed this
Fifth Day of May, 2015

Michelle K. Lee
*Director of the United States Patent and Trademark Office*